(12) United States Patent
Fu et al.

(10) Patent No.: US 7,431,764 B2
(45) Date of Patent: Oct. 7, 2008

(54) METHOD FOR PULLING UP SINGLE CRYSTAL

(75) Inventors: Senlin Fu, Tokyo (JP); Naoki Ono, Tokyo (JP)

(73) Assignee: Sumco Corporation, Tokyo (JP)

( * ) Notice: Subject to any disclaimer, the term of this patent is extended or adjusted under 35 U.S.C. 154(b) by 56 days.

(21) Appl. No.: 11/357,826

(22) Filed: Feb. 17, 2006

(65) Prior Publication Data

US 2006/0191469 A1 Aug. 31, 2006

(30) Foreign Application Priority Data

Feb. 17, 2005 (JP) ............................. 2005-039898

(51) Int. Cl.
- C30B 15/14 (2006.01)
- C30B 27/02 (2006.01)
- C30B 15/30 (2006.01)
- H01L 21/322 (2006.01)

(52) U.S. Cl. .................. 117/3; 117/2; 117/13; 117/14; 117/15; 117/20; 117/29; 117/202; 117/932

(58) Field of Classification Search .............. 117/2, 117/3, 13–15, 20, 29, 202, 932
See application file for complete search history.

(56) References Cited

U.S. PATENT DOCUMENTS 3,378,409 A * 4/1968 Hurle et al. .................. 117/40

(Continued)

FOREIGN PATENT DOCUMENTS

JP 11-001393 6/1999

(Continued)

OTHER PUBLICATIONS

Int. J. Heat Mass Reansfer, 33 1849 (1990), F. Dupret, P. Nicodeme, Y. Ryckmans, P. Wouters, and M. J. Crochet.

(Continued)

Primary Examiner—Robert M. Kunemund
Assistant Examiner—G. Nagesh Rao
(74) Attorney, Agent, or Firm—Duane Morris, LLP (57) ABSTRACT

The axial temperature gradient G at the vicinity of the solid-liquid interface 24 in an ingot is calculated in consideration of the heating value of a heater 18, the dimensions and physical property values of furnace inside components and the convection of the melt 12 before pulling up the single crystal ingot 15 by a puller 10 by use of a numerical simulation of synthetic heater transfers and a numerical simulation of melt convection. Then, the pulling velocity V of the single crystal ingot is determined from an value experienced of the ratio C=V/G of the pulling velocity V and the axial temperature gradient G of the single crystal ingot at which the single crystal ingot becomes defect-free, obtained when the single crystal ingot was pulled up by a same type puller as the puller in the past, and the axial temperature gradient G calculated by use of the simulations. Then, the ingot is pulled up at the pulling velocity, and the change value of the temperature gradient G to the deterioration value of partial furnace inside components roughly measured while the ingot is pulled up is roughly forecasted by use of the simulations. And further, the pulling velocity V of the ingot is adjusted in such a way that the ratio C should become the value experienced according to the change value of the temperature gradient G roughly forecasted.

2 Claims, 7 Drawing Sheets

U.S. PATENT DOCUMENTS

| | | | |
|---|---|---|---|
| 3,460,998 A * | 8/1969 | Mullin et al. | 117/41 |
| 3,934,983 A * | 1/1976 | Bardsley et al. | 117/202 |
| 4,008,387 A * | 2/1977 | Green et al. | 117/202 |
| 4,258,003 A * | 3/1981 | Hurle et al. | 117/202 |
| 4,565,598 A * | 1/1986 | Seymour | 117/15 |
| 5,817,176 A * | 10/1998 | Sung et al. | 117/201 |
| 5,868,831 A * | 2/1999 | Dornberger et al. | 117/15 |
| 6,045,610 A * | 4/2000 | Park et al. | 117/13 |
| 6,294,017 B1 * | 9/2001 | Hurle et al. | 117/13 |
| 6,869,478 B2 * | 3/2005 | Nakamura et al. | 117/14 |
| 2002/0166499 A1 * | 11/2002 | Kimura | 117/13 |

FOREIGN PATENT DOCUMENTS

JP  2001-261495  9/2001

OTHER PUBLICATIONS

Journal of Crystal Growth, 233, 687-698 (2001), D. Vizman, O. Graebner, G. Mueller.

* cited by examiner

METHOD FOR PULLING UP SINGLE CRYSTAL

CROSS-REFERENCES TO RELATED APPLICATION

This application claims priority of Japanese Application No. 2005-039898 filed Feb. 17, 2005, the entire disclosure of which is hereby incorporated by reference.

BACKGROUND OF THE INVENTION

1. Field of the Invention

The present invention relates to a method for pulling up a defect-free single crystal ingot by the Czochralski method (hereinafter referred to as CZ method).

2. Description of the Related Art

Along with the ultrafine configuration of recent semiconductor integrated circuit, as the factors to decrease the process yield of devices, there are known a Crystal Originated Particle (hereinafter referred to as COP), a fine defect of an oxygen precipitate that becomes the core of Oxidation induced Stacking Fault (hereinafter referred to as OSF), and the presence of Interstitial-type Large Dislocation (hereinafter referred to as L/D).

The COP is a pit that occurs on a wafer surface when a mirror-polished silicon wafer is cleaned with a compound liquid of ammonia and hydrogen peroxide. When this wafer is measured by use of a particle counter, this pit is detected as a particle. This pit originates from a crystal. The COP becomes the cause to deteriorate electrical characteristics, for example, a Time Dependent dielectric Breakdown (TDDB) of an oxide film, a Time Zero Dielectric Breakdown (TZDB) and the like. Further, the presence of the COP on a wafer surface causes a bump in a device wiring process, and may cause a breaking of wire. Furthermore, the COP causes a leakage and the like in the element separation portion, and decreases the process yield of products.

The OSF is a defect that comes to the surface in a thermal oxidation process and the like when a fine oxygen precipitate is introduced into a silicon single crystal at crystal growth, and a semiconductor device is manufactured. This OSF becomes a cause of failures such as the increase of leak current of device and the like. The L/D is also called a dislocation cluster, or a dislocation pit because the L/D causes a pit when a silicon wafer having this defect is dipped into a selective etching liquid composed mainly of fluorinated acid. This L/D becomes a cause to deteriorate electrical characteristics, for example, a leak characteristic, an isolation characteristic and the like. From the above, it is necessary to reduce the COP, the OSF, and the L/D in a silicon wafer used for manufacturing semiconductor integrated circuits.

A method for manufacturing a defect-free silicon single crystal wafer not including these COP, OSF and L/D has been disclosed (for example, refer to Patent Document 1). In this method for manufacturing a defect-free silicon single crystal wafer, there is a step wherein an ingot is pulled up in the axial direction from a silicon melt in a hot zone furnace, in a high pulling velocity profile enough to prevent interstitial lumps (agglomerate of interstitial silicon type point defects), and in a low pulling velocity profile enough to limit vacancy lumps (agglomerate of vacancy type point defects) within a vacancy rich area along the axial direction of the ingot. For this reason, when the pulling velocity of the ingot is defined as V (mm/min), and the axial temperature gradient at the vicinity of the solid-liquid interface of the silicon melt and the ingot is defined as G (° C./mm), by controlling V/G precisely, from a single ingot, a plurality of wafers composed of defect-free areas without the agglomerate of vacancy type point defects and the agglomerate of interstitial silicon type point defects can be manufactured.

From the above, it is known that a defect-free ingot is manufactured in the range of V/G (mm$^2$/min·° C.) in the area where the OSF (P band) that occurs in a ring shape when a thermal oxidation process is performed disappears, and there occurs no L/D (B band). In order to improve the productivity and yield and the like of this defect-free ingot, it is necessary to expand the width of the ingot pulling velocity, i.e., a pure margin for making a defect-free area in the pulling direction and radial direction of the ingot. It is considered that the pure margin has some correlativity with the solid-liquid interface shape at the moment when the ingot is pulled up.

Accordingly, a method for using the solid-liquid interface shape as the control factor for manufacturing a defect-free ingot has been studied, and a method for manufacturing a defect-free ingot in consideration of the shape of the solid-liquid interface of a silicon melt and a silicon single crystal ingot (for example, refer to Patent Document 2) has been disclosed. In this method for manufacturing a defect-free ingot, by appropriately adjusting the relation between the shape of the solid-liquid interface as the border of a silicon melt and a silicon single crystal ingot, and the temperature distribution at the side surface of the ingot during pulling, a defect-free ingot can be manufactured stably with excellent reproducibility.

Patent Document 1: Japanese Unexamined Patent Application Publication No. H11-1393 official gazette corresponding to U.S. Pat. No. 6,045,610 (claim 1, paragraph [0116])

Patent Document 2: Japanese Unexamined Patent Application Publication No. 2001-261495 official gazette (claim 1, paragraph [0148])

However, in the method for manufacturing a defect-free silicon single crystal wafer disclosed in the Patent Document 1 and the method for manufacturing a defect-free ingot disclosed in the Patent Document 2, the change of the axial temperature gradient G arising from the deterioration of furnace inside components of a single crystal puller such as a heater and the like is not taken into consideration, and accordingly, as an ingot is pulled up, defective portions increase inside of the ingot, which has been a problem. In concrete, because the heater becomes thin gradually while the ingot is pulled up, although the heating value per unit area of the heater increases and the axial temperature gradient G decreases gradually, in the manufacturing methods disclosed in the above prior-art Patent Documents 1 and 2, the ingot pulling velocity V is not controlled so as to decrease gradually, the V/G changes, and as one ingot is pulled up, defective portions gradually increase in the inside of the ingot.

Further, in the manufacturing methods disclosed in the above prior-art Patent Documents 1 and 2, it takes much time equivalent to the pulling time for several to several ten ingots by a single puller, to slice an ingot pulled up by the puller and manufacture wafers, and to inspect and confirm the quality of the wafers by observation and measurement, and so, if the ingots are left for this period without adjusting the ingot pulling velocity V in consideration of the change of the axial temperature gradient G arising from the deterioration of the furnace inside components, the yield of defect-free ingots gradually declines as the number of ingots pulled up increases, which has been another problem with the prior art.

BRIEF SUMMARY OF THE INVENTION

Accordingly, the object of the present invention is to provide a method for pulling up a single crystal for maintaining a single crystal ingot defect-free over its full length, and keeping the yield of a defect-free single crystal ingot high and stable.

An invention according to claim 1 is, as shown in FIG. 1 to FIG. 3 and FIG. 6, an improvement of a method for pulling up a single crystal ingot 15 from a melt 12 where either a single crystal or a poly crystal or the both of them are melted by a heater 18 in the furnace of a single crystal puller 10.

The characteristic constitution thereof includes a step for calculating the axial temperature gradient G at the vicinity of the solid-liquid interface 24 in a single crystal ingot 15 that grows from a melt 12 in consideration of the heating value of a heater 18, the dimensions and physical property values of furnace inside components and the convection of the melt 12 before pulling up the single crystal ingot 15 by the puller 10 by use of a numerical simulation of synthetic heater transfers and a numerical simulation of melt convection; a step for determining the pulling velocity V of the single crystal ingot 15 from an value experienced of the ratio C=V/G of the pulling velocity V and the axial temperature gradient G of the single crystal ingot 15 at which the single crystal ingot 15 becomes defect-free, obtained when the single crystal ingot 15 was pulled up by a same type puller as the puller 10 in the past, and the axial temperature gradient G calculated by use of the numerical simulation of synthetic heater transfers and the numerical simulation of melt convection; a step for pulling up the single crystal ingot 15 by the puller 10 at the pulling velocity V; a step for roughly measuring the deterioration value of partial furnace inside components that can be measured while the single crystal ingot 15 is pulled up by the puller 10 among the furnace inside components that give influences to the axial temperature gradient G; a step for roughly forecasting the change value of the axial temperature gradient G to the deterioration value of the partial furnace inside components roughly measured in the puller 10 by use of the numerical simulation of synthetic heater transfers and the numerical simulation of melt convection; and a step for adjusting the pulling velocity V of the single crystal ingot 15 by the puller 10 in such a way that the ratio C should become the value experienced according to the change value of the axial temperature gradient G roughly forecasted in the puller 10.

In the method for pulling up a single crystal described in this claim 1, after the deterioration value of partial furnace inside components that can be measured while the single crystal ingot 15 is pulled up and give influences to the axial temperature gradient G is roughly measured, a numeric value simulation by use of the numerical simulation of synthetic heater transfers and the numerical simulation of melt convection is performed in consideration of the change value of the axial temperature gradient G arising from the deterioration of the partial furnace inside components, thereby the adjustment value $\Delta V$ of the pulling velocity V of the ingot 15 necessary to the change value $\Delta G$ of the axial temperature gradient G is calculated and the pulling velocity V of the ingot 15 is adjusted. As a result, at every specified time while one ingot 15 is pulled up, the pulling velocity is adjusted to the optimal pulling velocity V for pulling up the defect-free ingot 15, and accordingly, it is possible to maintain one ingot 15 defect-free over its full length.

An invention according to claim 2 is an invention according to the claim 1, and as shown in FIG. 1 to FIG. 3 and FIG. 6, it further includes a step for precisely measuring the deterioration value of all the furnace inside components that give influences to the axial temperature gradient G, after adjusting the pulling velocity V of the single crystal ingot 15 by the single crystal puller 10 and pulling up the single crystal ingot 15, and before pulling up the next single crystal ingot 15 by the puller 10; a step for precisely forecasting the change value of the axial temperature gradient G to the deterioration value of all the furnace inside components precisely measured in the puller 10 by use of the numerical simulation of synthetic heater transfers and the numerical simulation of melt convection; a step for determining the pulling velocity V of the next single crystal ingot 15 by the puller 10 in such a way that the ratio C should become the value experienced according to the change value of the axial temperature gradient G precisely forecasted in the puller 10; a step for pulling up the next single crystal ingot 15 by the puller 10 at the determined pulling velocity V; a step for roughly measuring the deterioration value of partial furnace inside components that can be measured while the single crystal ingot 15 is pulled up by the puller 10 among the furnace inside components that give influences to the axial temperature gradient G; a step for roughly forecasting the change value of the axial temperature gradient G to the deterioration value of the partial furnace inside components roughly measured in the puller 10 by use of the numerical simulation of synthetic heater transfers and the numerical simulation of melt convection, and a step for adjusting the pulling velocity V of the single crystal ingot 15 by the puller 10 in such a way that the ratio C should become the value experienced according to the change value of the axial temperature gradient G roughly forecasted in the puller 10.

In the method for pulling up a single crystal described in this claim 2, as described in the above claim 1, it is possible to maintain one ingot 15 defect-free over its full length, and at every time when the single crystal ingot 15 is pulled up, the change value of the axial temperature gradient G to the deterioration value of all the furnace inside components is precisely measured, and a numeric value simulation by use of the numerical simulation of synthetic heater transfers and the numerical simulation of melt convection is performed in consideration of the change value of the axial temperature gradient G arising from the deterioration of all the partial furnace inside components, thereby the adjustment value $\Delta V$ of the pulling velocity V of the ingot 15 necessary to the change value $\Delta G$ of the axial temperature gradient G is calculated and the pulling velocity V of the next ingot 15 is adjusted. As a result, at every specified time while one ingot 15 is pulled up, the pulling velocity is adjusted to the optimal pulling velocity V for pulling up the defect-free ingot 15, and accordingly, it is possible to maintain the yield of the defect-free ingot 15 high and stable.

An invention according to claim 2 is, as shown in FIG. 1 to FIG. 3 and FIG. 6, a method for pulling up a single crystal that includes a step for inspecting the quality of an ingot 15 pulled up by the method according to claim 1 and correcting a numerical simulation of synthetic heater transfers, a numerical simulation of melt convection and the ratio C; a step for precisely forecasting the change value of the axial temperature gradient G to the deterioration value of all the furnace inside components that give influences to the axial temperature gradient G precisely measured just after completion of the correcting step by use of the corrected numerical simulation of synthetic heater transfers and the corrected numerical simulation of melt convection; a step for determining the pulling velocity V of a new single crystal ingot 15 by the puller 10 in such a way that the ratio C should become the corrected value according to the change value of the axial temperature gradient G precisely forecasted in the puller 10; a step for pulling up the new single crystal ingot 15 by the puller 10 at the determined pulling velocity V; a step for roughly measuring the deterioration value of partial furnace inside components that can be measured while the single crystal ingot 15 is pulled up by the puller 10 among the furnace inside components that give influences to the axial temperature gradient G; a step for roughly forecasting the change value of the axial temperature gradient G to the deterioration value of the partial furnace inside components roughly measured in the puller 10 by use of the numerical simulation of synthetic heater transfers and the numerical simulation of melt convection, and a step for adjusting the pulling velocity V of the single crystal ingot 15 by the puller 10 in such a way that the ratio C should become the corrected value according to the change value of the axial temperature gradient G roughly forecasted in the puller 10.

In the method for pulling up a single crystal, as described in the above claim 2, it is possible to maintain one ingot 15 defect-free over its full length, and it is possible to maintain the yield of the defect-free ingot 15 high and stable, and at every moment when several to several ten ingots 15 are pulled up, the quality of the ingots is inspected, and the numerical simulation of synthetic heater transfers, the numerical simulation of melt convection and the ratio C are corrected so as to forecast the optimal pulling velocity V for pulling up the defect-free ingot 15, thereby accumulative errors that arise from the structural changes in the furnace of the puller 10 and give influences to the forecasted pulling velocity V can be eliminated, as a consequence, it is possible to maintain the yield of the defect-free ingot 15 further higher and more stable.

Figure 1:
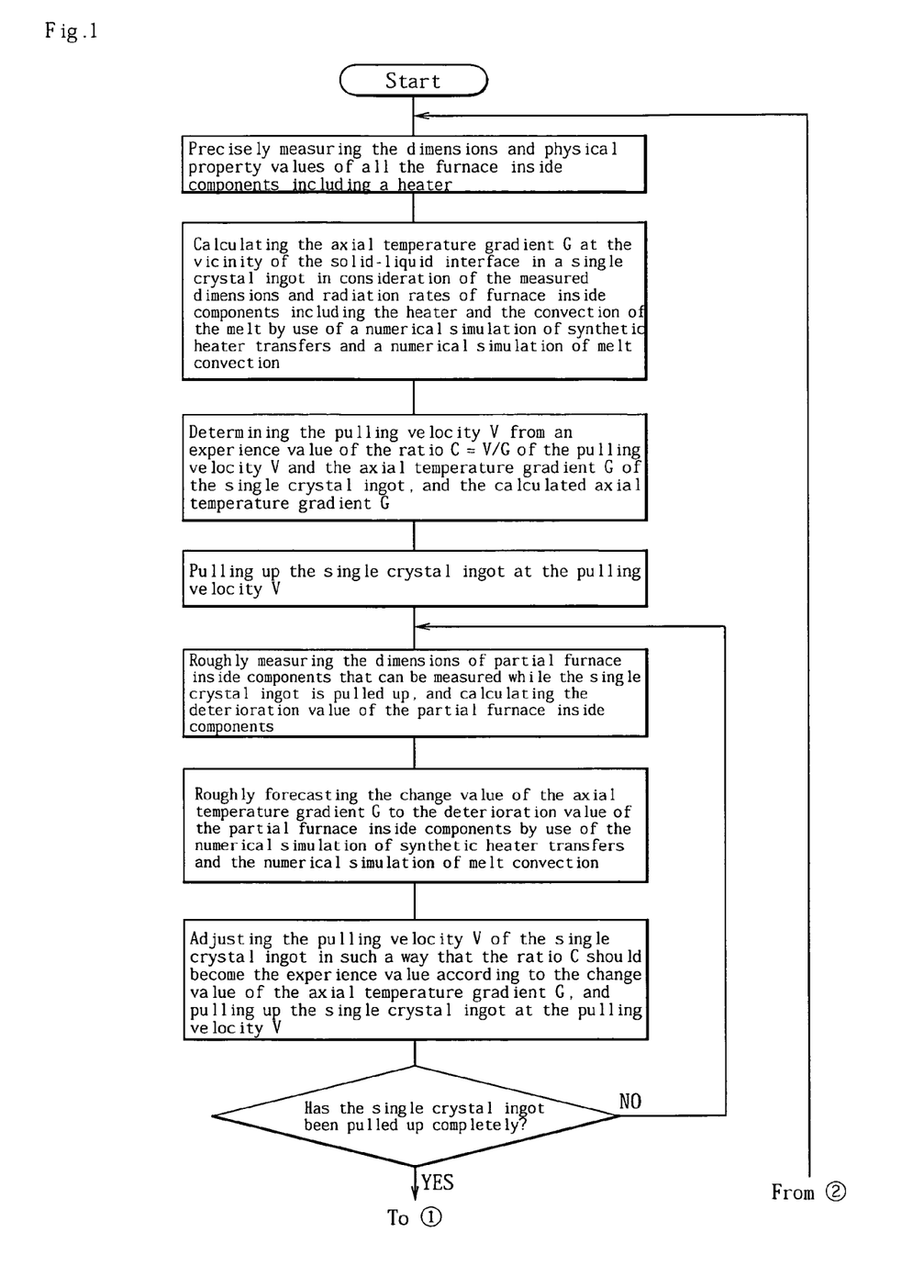
FIG. 1 is a flow chart showing the front stage of a method for pulling up a single crystal according to a first embodiment of the present invention.
Figure 2:
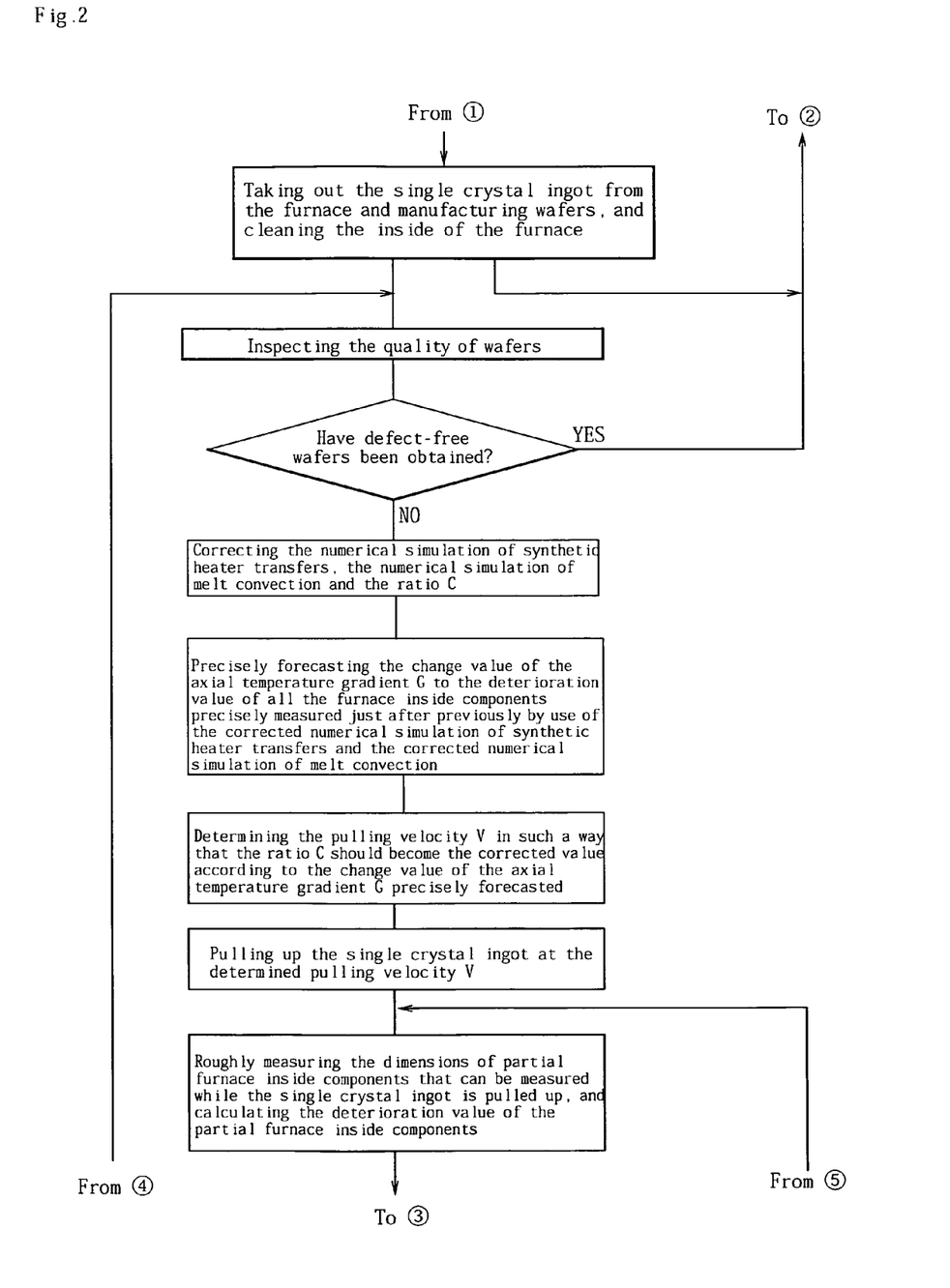
FIG. 2 is a flow chart showing the middle stage of the method for pulling up a single crystal.
Figure 3:
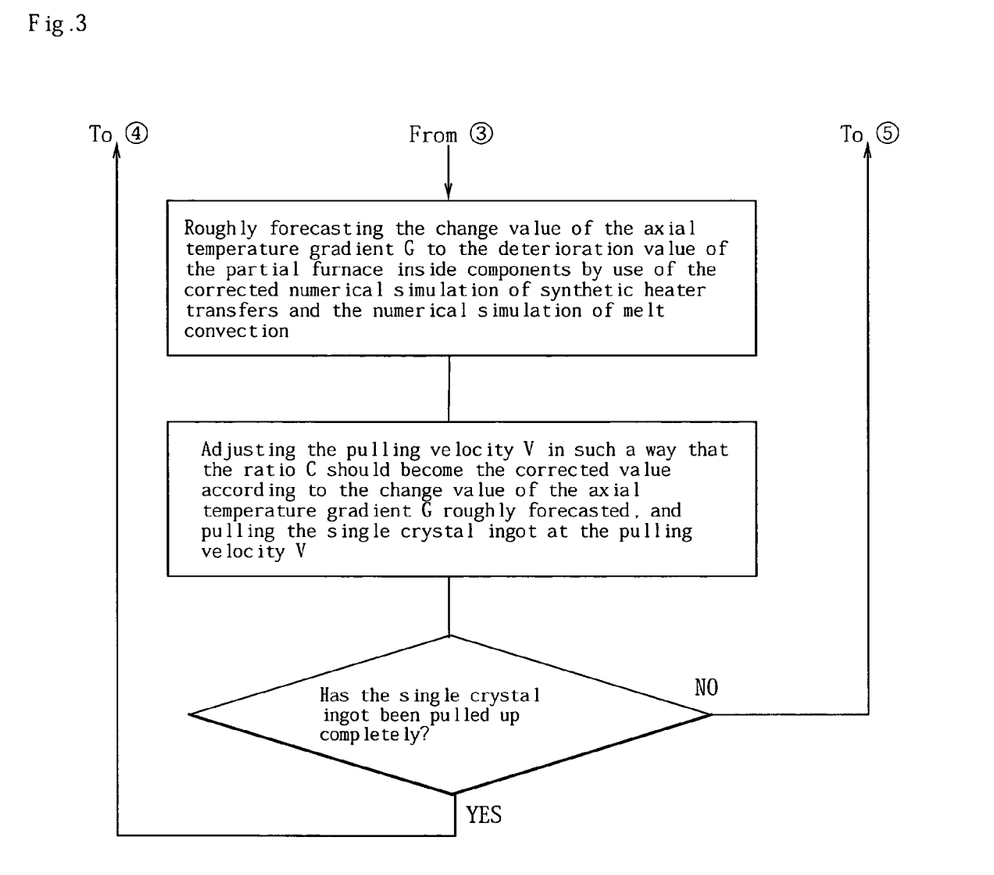
FIG. 3 is a flow chart showing the rear stage of the method for pulling up a single crystal.
Figure 4:
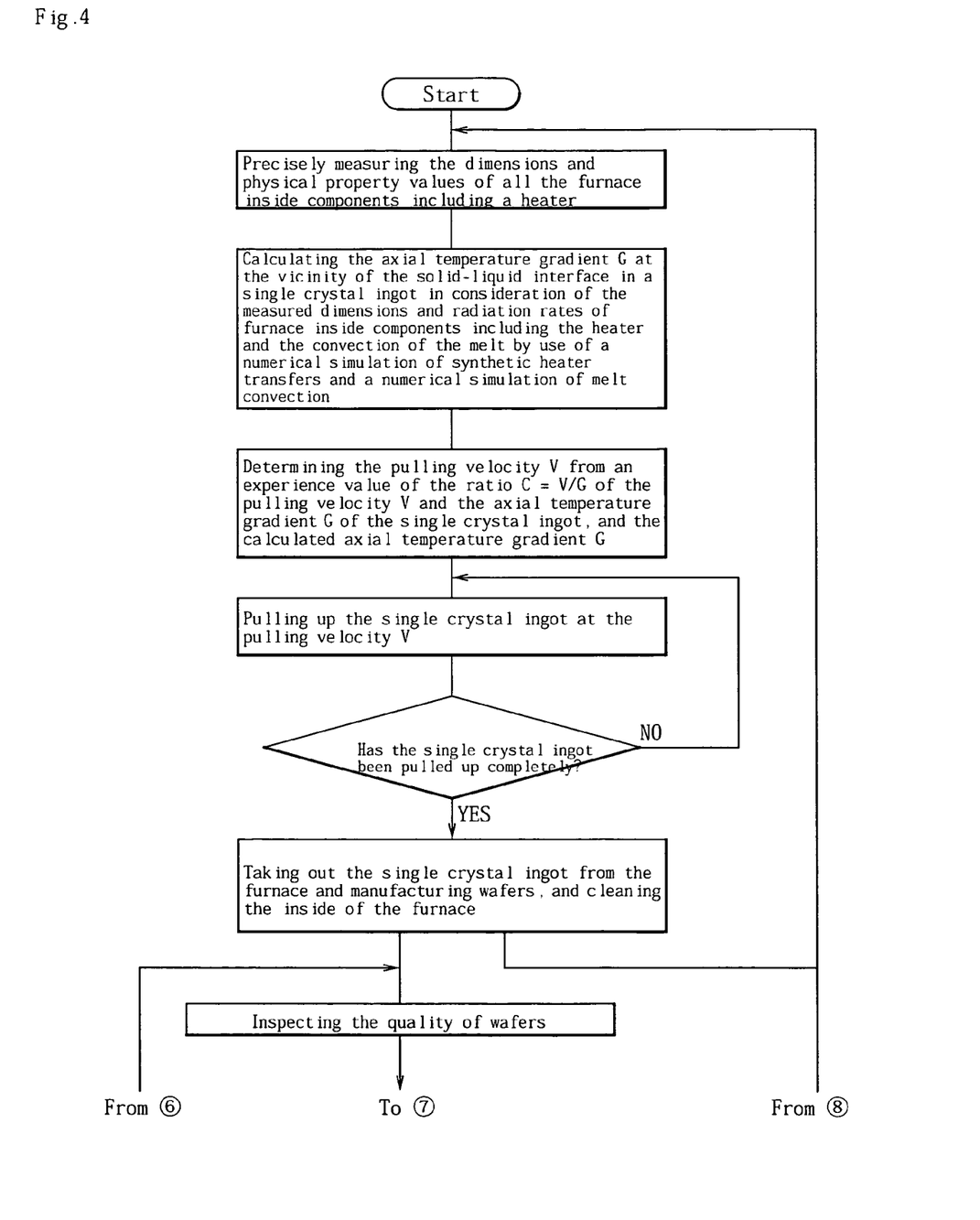
FIG. 4 is a flow chart showing the first half stage of a method for pulling up a single crystal according to a second embodiment of the present invention.
Figure 5:
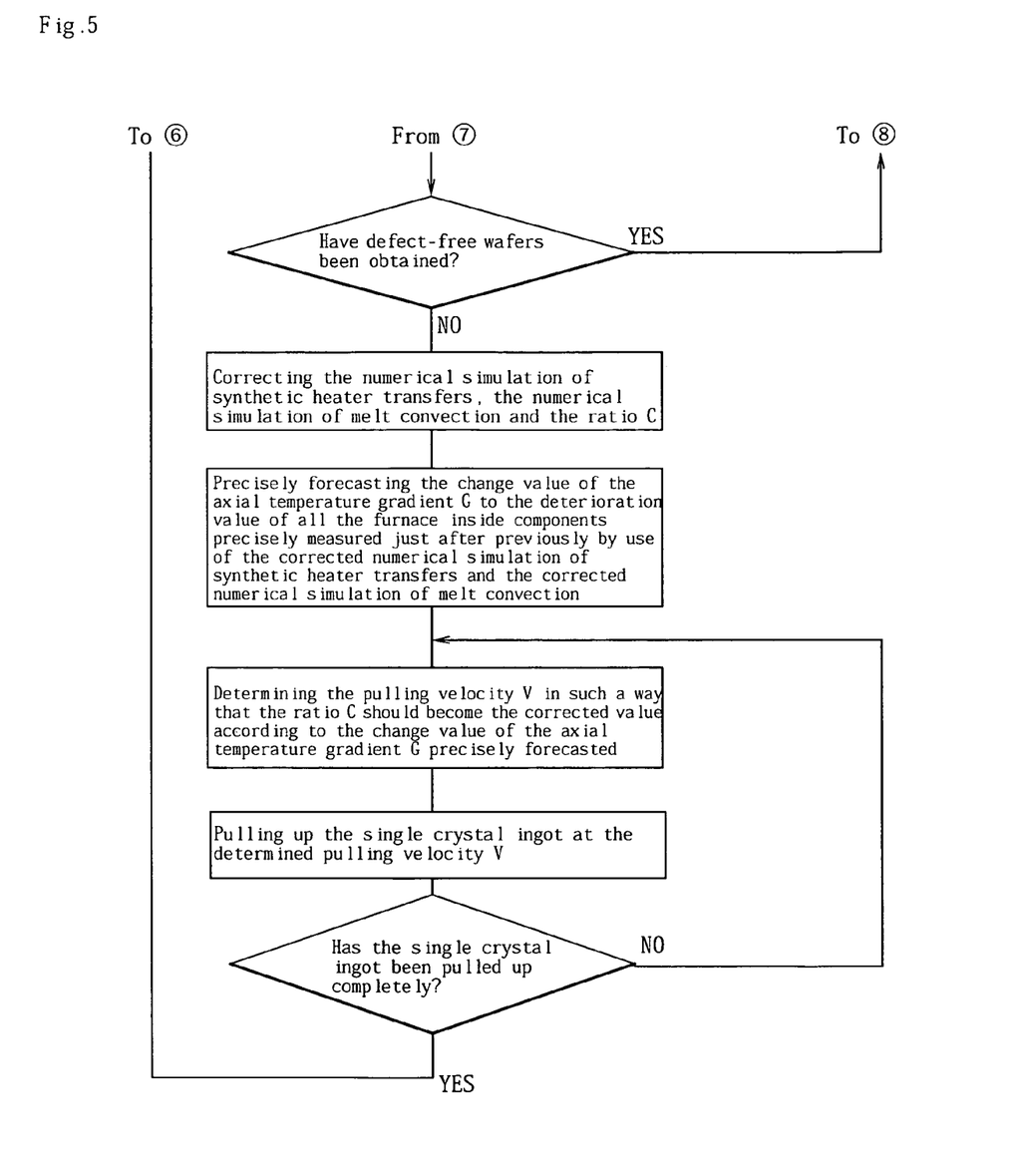
FIG. 5 is a flow chart showing the last half stage of the method for pulling up a single crystal.
Figure 6:
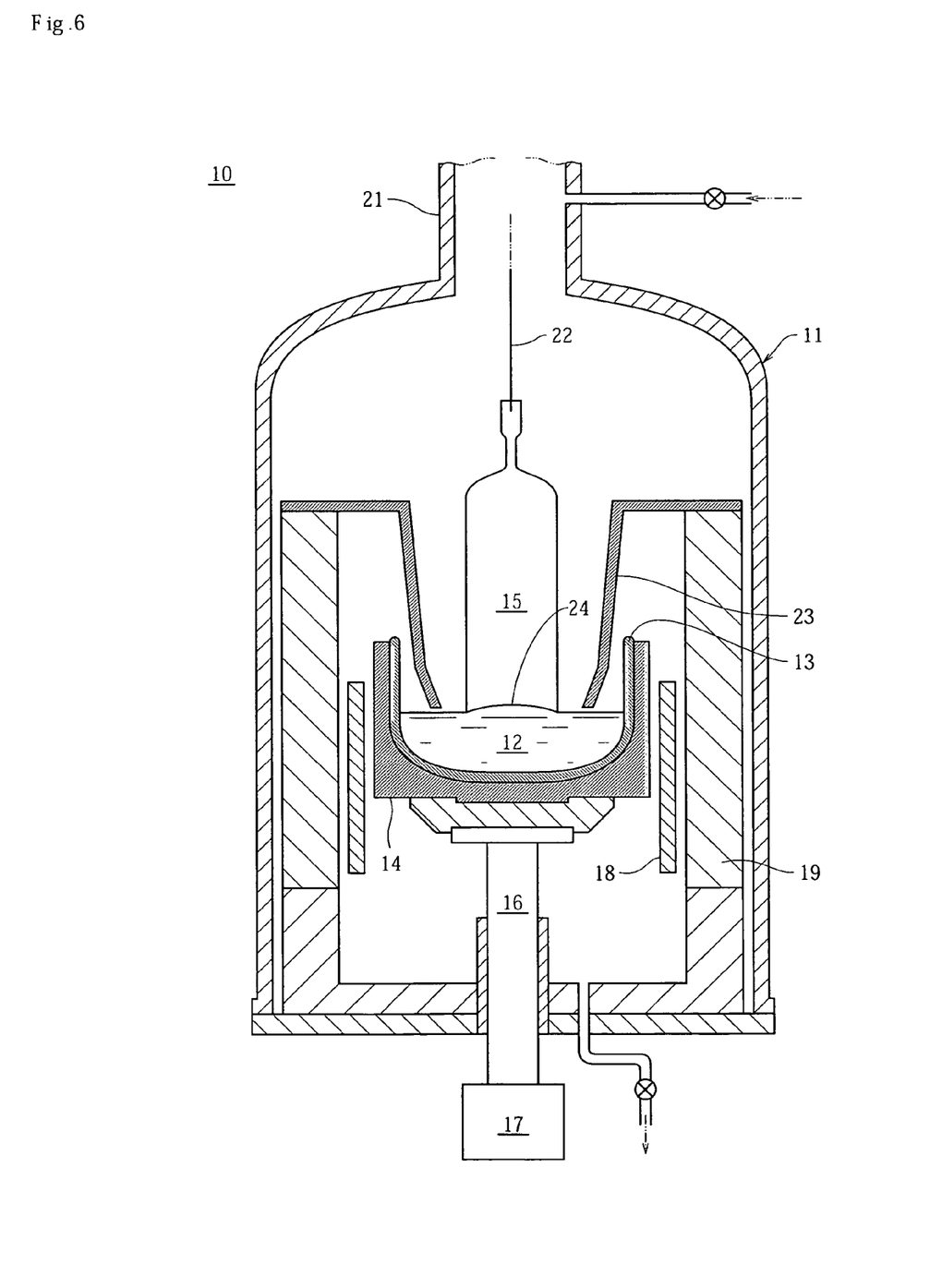
FIG. 6 is a cross sectional view showing a single crystal puller used in the methods according to the first and second embodiments of the present invention.

An invention according to claim 2 is, as shown in FIG. 4 to FIG. 6, an improvement of a method for pulling up a single crystal ingot 15 from a melt 12 where either a single crystal or a poly crystal or the both of them are melted by a heater 18 in the furnace of a single crystal puller 10.

The characteristic constitution thereof includes a step for calculating the axial temperature gradient G at the vicinity of the solid-liquid interface 24 in a single crystal ingot 15 that grows from a melt 12 in consideration of the heating value of a heater 18, the dimensions and physical property values of furnace inside components and the convection of the melt 12 before pulling up the single crystal ingot 15 by a puller 10 by use of a numerical simulation of synthetic heater transfers and a numerical simulation of melt convection; a step for determining the pulling velocity V of the single crystal ingot 15 from an value experienced of the ratio C=V/G of the pulling velocity V and the axial temperature gradient G of the single crystal ingot 15 at which the single crystal ingot 15 becomes defect-free, obtained when the single crystal ingot 15 was pulled up by a same type puller as the puller 10 in the past, and the axial temperature gradient G calculated by use of the numerical simulation of synthetic heater transfers and the numerical simulation of melt convection; a step for pulling up the single crystal ingot 15 by the puller 10 at the pulling velocity V; a step for precisely measuring the deterioration value of all the furnace inside components that give influences to the axial temperature gradient G, after pulling up the single crystal ingot 15 by the puller 10, and before pulling up the next single crystal ingot 15 by the puller 10; a step for precisely forecasting the change value of the axial temperature gradient G to the deterioration value of all the furnace inside components precisely measured in the puller 10 by use of the numerical simulation of synthetic heater transfers and the numerical simulation of melt convection; a step for determining the pulling velocity V of the next single crystal ingot 15 by the puller 10 in such a way that the ratio C should become the value according to the change value of the axial temperature gradient G precisely forecasted in the puller 10, and a step for pulling up the next single crystal ingot 15 by the puller 10 at the determined pulling velocity V.

In the method for pulling up a single crystal described in this claim 2, at every time when the single crystal ingot 15 is pulled up, the deterioration value of all the furnace inside components that give influences to the axial temperature gradient G is precisely measured, and a numeric value simulation by use of the numerical simulation of synthetic heater transfers and the numerical simulation of melt convection is performed in consideration of the change value of the axial temperature gradient G arising from the deterioration of all the partial furnace inside components, thereby the adjustment value ΔV of the pulling velocity V of the ingot 15 necessary to the change value ΔG of the axial temperature gradient G is calculated and the pulling velocity V of the next ingot 15 is adjusted. As a result, at every specified time while one ingot 15 is pulled up, the optimal pulling velocity V for pulling up the defect-free ingot 15 is determined, and accordingly, it is possible to maintain the yield of the defect-free ingot 15 high and stable.

An invention according to claim 2 is, as shown in FIG. 4 to FIG. 6, a method for pulling up a single crystal that includes a step for inspecting the quality of an ingot 15 pulled up by the method according to claim 1 and correcting a numerical simulation of synthetic heater transfers, a numerical simulation of melt convection and the ratio C; a step for precisely forecasting the change value of the axial temperature gradient G to the deterioration value of all the furnace inside components that give influences to the axial temperature gradient G precisely measured just after completion of the correcting step by use of the corrected numerical simulation of synthetic heater transfers and the corrected numerical simulation of melt convection; a step for determining the pulling velocity V of a new single crystal ingot 15 by the puller 10 in such a way that the ratio C should become the corrected value according to the change value of the axial temperature gradient G precisely forecasted in the puller 10, and a step for pulling up the new single crystal ingot 15 by the puller 10 at the determined pulling velocity V.

In the method for pulling up a single crystal described in this claim 2, as described in the above claim 1, it is possible to maintain the yield of the defect-free ingot 15 high and stable, and at every moment when several to several ten ingots 15 are pulled up, the quality of the ingots is inspected, and the numerical simulation of synthetic heater transfers, the numerical simulation of melt convection and the ratio C are corrected so as to forecast the optimal pulling velocity V for pulling up the defect-free ingot 15, thereby accumulative errors that arise from the structural changes in the furnace of the puller 10 and give influences to the forecasted pulling velocity V can be eliminated, as a consequence, it is possible to maintain the yield of the defect-free ingot 15 further higher and more stable.

As described above, according to the present invention, the axial temperature gradient G at the vicinity of the solid-liquid interface in an ingot is calculated in consideration of the heating value of a heater and the dimensions and physical property values of furnace inside components and the convection of the melt before pulling up the single crystal ingot by a puller by use of a numerical simulation of synthetic heater transfers and a numerical simulation of melt convection, and the pulling velocity V of the ingot is determined from an value experienced of the ratio C=V/G of the past pulling velocity V and the past axial temperature gradient G, and the axial temperature gradient G calculated by the above simulations, thereafter, the ingot is pulled up at the pulling velocity V, and the change value of the axial temperature gradient G to the deterioration value of partial furnace inside components roughly measured while the ingot is pulled up is roughly forecasted by use of the simulations, and further, the pulling velocity V of the ingot is adjusted in such a way that the ratio C should become the value experienced according to the change value of the axial temperature gradient G roughly forecasted, namely, at every specified time while one ingot is pulled up, the pulling velocity is adjusted to the optimal pulling velocity V for pulling up the defect-free ingot, and accordingly, it is possible to maintain one ingot defect-free over its full length.

Further, after adjusting the pulling velocity V of the ingot and pulling up the, and before pulling up the next ingot, the deterioration value of all the furnace inside components that give influences to the axial temperature gradient G is precisely measured, and the change value of the axial temperature gradient G to the deterioration value of all the furnace inside components precisely measured is precisely forecasted by the simulations, and the pulling velocity V of the next ingot is determined in such a way that the ratio C should become the value experienced according to the change value of the axial temperature gradient G precisely forecasted and the next ingot is pulled up at the determined pulling velocity V, and the change value of the axial temperature gradient G to the deterioration value of the partial furnace inside components roughly measured while the ingot is pulled up is roughly forecasted by use of the simulations, and the pulling velocity V of the ingot by the puller is adjusted in such a way that the ratio C should become the value experienced according to the change value of the axial temperature gradient G roughly forecasted, and accordingly, it is possible to maintain one single crystal ingot defect-free over its full length, and at every time when the ingot is pulled up, the optimal pulling velocity V for pulling up the defect-free ingot is determined, therefore, it is possible to maintain the yield of the defect-free ingot high and stable.

Furthermore, the quality of the ingot pulled up by the above method is inspected and the simulations and the ratio C are corrected, and the change value of the axial temperature gradient G to the deterioration value of all the furnace inside components precisely measured just after completion of the correction is precisely forecasted by use of the simulations, and the pulling velocity V of a new ingot is determined in such a way that the ratio C should become the corrected value according to the change value of the axial temperature gradient G precisely forecasted, and the new ingot is pulled up at the determined pulling velocity V, and the deterioration value of partial furnace inside components measured while the ingot is pulled up is roughly forecasted by use of the corrected simulations, and the pulling velocity V of the ingot is adjusted in such a way that the ratio C should become the corrected value according to the change value of the axial temperature gradient G roughly forecasted, and accordingly, as described above, it is possible to maintain one ingot defect-free over its full length, and it is possible to maintain the yield of the defect-free ingot high and stable, and further, accumulative errors that arise from the structural changes in the furnace of the puller and give influences to the forecasted pulling velocity V can be eliminated, as a consequence, it is possible to maintain the yield of the defect-free ingot further higher and more stable.

Moreover, the axial temperature gradient G at the vicinity of the solid-liquid interface in a ingot is calculated in consideration of the heating value of a heater, the dimensions and physical property values of furnace inside components and the convection of the melt before pulling up the ingot by use of the numerical simulation of synthetic heater transfers and the numerical simulation of melt convection, and the pulling velocity V of the ingot is determined from an value experienced of the ratio C=V/G of the past pulling velocity V and the past axial temperature gradient G of the ingot calculated by use of the simulations, thereafter, the ingot is pulled up at the pulling velocity V, and after pulling up the ingot, and before pulling up the next ingot, the deterioration value of all the furnace inside components that give influences to the axial temperature gradient G is precisely measured, and the change value of the axial temperature gradient G to the deterioration value of all the furnace inside components precisely measured is precisely forecasted by use of the simulations, and the pulling velocity V of the next ingot is determined in such a way that the ratio C should become the value experienced according to the change value of the axial temperature gradient G precisely forecasted, and the next ingot is pulled up at the determined pulling velocity V, and accordingly, at every time when the ingot is pulled up, the optimal pulling velocity V for pulling up the defect-free ingot is determined, thereby, it is possible to maintain the yield of the defect-free ingot high and stable.

Further, the quality of an ingot pulled up by the above method is inspected and the above simulations and the ratio C are corrected, and the change value of the axial temperature gradient G to the deterioration value of all the furnace inside components precisely measured just after completion of the correction is precisely forecasted by use of the above corrected simulations, and the pulling velocity V of a new ingot is determined in such a way that the ratio C should become the corrected value according to the change value of the axial temperature gradient G precisely forecasted, and the new ingot is pulled up at the determined pulling velocity V, and accordingly, as described above, it is possible to maintain the yield of the defect-free ingot high and stable, and accumulative errors that arise from the structural changes in the furnace of the puller and give influences to the forecasted pulling velocity V can be eliminated, as a consequence, it is possible to maintain the yield of the defect-free ingot further higher and more stable.

DETAILED DESCRIPTION OF THE INVENTION

Preferred embodiments according to the present invention are illustrated in more details with reference to the attached drawings hereinafter.

First Preferred Embodiment

As shown in FIG. 6, in a chamber 11 of a puller 10 of a silicon single crystal ingot 15, a quartz crucible 13 that stores a silicon melt 12 is arranged. The quartz crucible 13 is connected via a graphite suscepter 14 and a supporting shaft 16 to a crucible driving unit 17, and the crucible driving unit 17 is composed so as to rotate and move up and down the quartz crucible 13. Further, the external circumferential surface of the quartz crucible 13 is surrounded by a heater 18 with a specified distance from the quartz crucible 13, and this heater 18 is surrounded by a heat retention cylinder 19. The heater 18 heats and melts either a highly pure silicon poly crystal material or a silicon single crystal material or both of them charged into the quartz crucible 13 into a silicon melt 12. Further, to the upper end of the chamber 11, a cylindrical casing 21 is connected, and to the casing 21, a pulling unit 22 is arranged. The pulling unit 22 is composed so as to rotate and pull up the ingot 15. Further, in order to defilade the heat from the heater 18 to the ingot 15 that is pulled up from the silicon melt 12, the external circumferential surface of the ingot 15 is surrounded by a heat shield member 23 with a specified distance.

The method for pulling up the ingot 15 in the puller 10 composed as above is explained with reference to FIG. 1 to FIG. 3 and FIG. 6.

Before the ingot 15 is pulled up by the puller, the heating value of the heater 18 and the dimensions and physical property values of furnace inside components are precisely measured and input into a computer. Herein, the furnace inside components mean those components that give influences to the axial temperature gradient G in the ingot 15 at the vicinity of the solid-liquid interface 24 between the silicon melt 12 and the ingot 15 that is pulled up from this melt 12, and in concrete, includes the chamber 11, the graphite suscepter 14, the heater 18, the heat retention cylinder 19, the heat shield member 23, and further, a water-cooled tube, an indirect measuring device of furnace inside components such as the heater, a heater temperature measuring device, a heater controlling device, a crystal diameter measuring and controlling device, a pulling velocity measuring and controlling device and the like though not illustrated therein. Further, the precise measurement herein means to measure the heating value of the heater 18 and the dimensions and radiation rates of furnace inside components, not by indirect manners but by precise and direct manners. Further, as the physical property values of the furnace inside components, there are radiation rates, heat conductivity rates, viscosity coefficients, cubical expansion coefficients, density degrees and specific heats of the furnace inside components.

Then, the axial temperature gradient G at the vicinity of the solid-liquid interface 24 in the ingot 15 that grows from the melt 12 is calculated in consideration of the heating value of the heater 18, the dimensions and physical property values of furnace inside components precisely measured and the convection of the melt 12 by use of the numerical simulation of synthetic heater transfers and the numerical simulation of melt convection. In concrete, first, a stationary calculation without consideration of the rotations of the quartz crucible 13 and the ingot 15 and the convection of the melt 12 is performed by the computer, namely, the radiation heat in the furnace of the puller 10 and the heat conductivity of the furnace inside components are coupled and the temperature distribution in the furnace is obtained by use of the numerical simulation of synthetic heater transfers. Then, from the temperature distribution in the furnace, border conditions for melt convection calculation are determined, and from the border conditions, the melt convection calculation is performed by the computer by use of the numerical simulation of melt convection. Thereby, the precise temperature distribution in the ingot 15 such as the shape of the solid-liquid interface 24, the internal temperature history in the ingot 15, the heat flux and the like is obtained, and the axial temperature gradient G is calculated by use of the temperatures from the surface of the melt 12 on the central axis of the ingot 15 to 10 mm above the surface of the melt 12. Because this axial temperature gradient G is calculated by inputting the value experienced of the pulling velocity V of the ingot 15 beforehand, it is examined whether the ratio V/G of the value experienced of the pulling velocity V of the ingot 15 and the calculated axial temperature gradient G coincides with the value experienced of the ratio C=V/G of the pulling velocity V of the ingot 15 at which the ingot 15 becomes defect-free, obtained when the ingot 15 was pulled up by a same type puller as the puller 10 in the past, and the axial temperature gradient G, and if it does not coincide, the product of the value experienced of the ratio C and the calculated axial temperature gradient G is input to the computer as the corrected pulling velocity, and the calculation is performed once again. This process is repeated until the ratio V/G of the corrected pulling velocity V and the calculated axial temperature gradient G coincides with the value experienced of the ratio C. Thereby, the initial pulling velocity V of the ingot 15 is determined. Meanwhile, as the numerical simulation of synthetic heater transfers, there are well-known Femag (F. Dupret, P. Nicodeme, Y. Ryckmans, P. Wouters, and M. J. Crochet, Int. J. Heat Mass Reansfer, 33 1849 (1990)), Sthmas (D. Vizman, O. Graebner, G. Mueller, Journal of Crystal Growth, 233, 687-698 (2001)), and the like, meanwhile as the numerical simulation of melt convection, in the same manner as the above, there are well-known Femag (F. Dupret, P. Nicodeme, Y. Ryckmans, P. Wouters, and M. J. Crochet, Int. J. Heat Mass Reansfer, 33 1849 (1990)), Sthmas (D. Vizman, O. Graebner, G. Mueller, Journal of Crystal Growth, 233, 687-698 (2001)), and the like.

At this determined pulling velocity V, the ingot 15 is pulled up by the puller 10. Then, the deterioration value of partial furnace inside components that can be measured while the ingot 15 is pulled up by the puller 10 among the furnace inside components that give influences to the axial temperature gradient G is roughly measured. As the partial furnace inside components, there are the heater 18, the graphite suscepter 14, the heat shield member 13 and the like. Further, the rough measurement means, for example in the case of the heater 18, to measure the thickness of the heater 18 indirectly from an inspection hole (not illustrated therein) of the chamber 11. Next, the change value of the axial temperature gradient G to the deterioration value of the partial furnace inside components roughly measured is roughly forecasted in the same manner as the above by use of the numerical simulation of synthetic heater transfers and the numerical simulation of melt convection, then, the pulling velocity V of the ingot 15 by the puller is adjusted in such a way that the ratio C should become the value experienced according to the change value of the axial temperature gradient G roughly forecasted. Namely, after the deterioration value of partial furnace inside components that can be measured while one ingot 15 is pulled up and give influences to the axial temperature gradient G is roughly measured, a numeric value simulation by use of the numerical simulation of synthetic heater transfers and the numerical simulation of melt convection is performed in consideration of the change value of the axial temperature gradient G arising from the deterioration of the partial furnace inside components, thereby the adjustment value ΔV of the pulling velocity V of the ingot 15 necessary to the change value ΔG of the axial temperature gradient G is calculated and the pulling velocity V of the ingot 15 is adjusted. As a result, at every specified time while one ingot 15 is pulled up (at every 1 to 300 minutes), the pulling velocity is adjusted to the optimal pulling velocity V for pulling up the defect-free ingot 15, and accordingly, it is possible to maintain one ingot 15 defect-free over its full length. Meanwhile, when the heater 18 deteriorates, the thickness thereof becomes thin. It is considered that this occurs because when inactive gas in the chamber 11 flows along the internal circumferential surface of the heater 18, oxygen in $SiO_2$ gas included in the inactive gas and carbon composing the heater 18 react with each other, and become CO and is discharged together with the inactive gas to the outside.

Meanwhile, after adjusting the pulling velocity V of the ingot 15 by the puller 10 and pulling up the single crystal ingot 15, and before pulling up the next ingot 15 by the puller 10, the deterioration value of all the furnace inside components that give influences to the axial temperature gradient G is precisely measured. Then, the change value of the axial temperature gradient G to the deterioration value of all the furnace inside components precisely measured is precisely forecasted by use of the numerical simulation of synthetic heater transfers and the numerical simulation of melt convection, and the pulling velocity V of the next ingot 15 by the puller 10 is determined in such a way that the ratio C should become the value experienced according to the change value of the axial temperature gradient G precisely forecasted. In other words, at every time when the ingot 15 is pulled up, the deterioration value of all the furnace inside components that give influences to the axial temperature gradient G is precisely measured, and a numeric value simulation by use of the numerical simulation of synthetic heater transfers and the numerical simulation of melt convection is performed in consideration of the change value of the axial temperature gradient G arising from the deterioration of all the partial furnace inside components, thereby the adjustment value ΔV of the pulling velocity V of the ingot 15 necessary to the change value ΔG of the axial temperature gradient G is calculated and the pulling velocity V of the next ingot 15 is determined. As a result, at every time when the ingot 15 is pulled up, the pulling velocity is determined to the optimal pulling velocity V for pulling up the defect-free ingot 15, and accordingly, it is possible to maintain the yield of the defect-free ingot 15 high and stable.

Furthermore, at every moment when several to several ten ingots 15 are pulled up by the above method, the quality of the ingots 15 is inspected, and the numerical simulation of synthetic heater transfers, the numerical simulation of melt convection and the ratio C are corrected. The change value of the axial temperature gradient G to the deterioration value of all the furnace inside components that give influences to the axial temperature gradient G precisely measured just after completion of the correcting step is precisely forecasted by use of the corrected numerical simulation of synthetic heater transfers and the corrected numerical simulation of melt convection, then the pulling velocity V of a new ingot 15 by the puller 10 is determined in such a way that the ratio C should become the corrected value according to the change value of the axial temperature gradient G precisely forecasted. Then, at this determined pulling velocity V, the new ingot 15 is pulled up.

Namely, at every moment when several to several ten ingots 15 are pulled up, the quality of the ingots 15 is inspected, and the numerical simulation of synthetic heater transfers, the numerical simulation of melt convection and the ratio C are corrected so as to forecast the optimal pulling velocity V for pulling up the defect-free ingot 15, thereby accumulative errors that arise from the structural changes in the furnace of the puller 10 and give influences to the forecasted pulling velocity V can be eliminated, as a consequence, it is possible to maintain the yield of the defect-free ingot 15 further higher and more stable.

Second Preferred Embodiment

FIG. 4 to FIG. 6 show a second preferred embodiment of the present invention.

In the present preferred embodiment, in the case where the deterioration value of the furnace inside components cannot be roughly measured while one ingot 15 is pulled up, and the adjustment of the pulling velocity V of the ingot 15 is not performed when one ingot 15 is pulled up, and at every time when the ingot 15 is pulled up, the deterioration value of all the furnace inside components that give influences to the axial temperature gradient G is precisely measured, and a numeric value simulation by use of the numerical simulation of synthetic heater transfers and the numerical simulation of melt convection is performed in consideration of the change value of the axial temperature gradient G arising from the deterioration of all the partial furnace inside components, thereby the adjustment value ΔV of the pulling velocity V of the ingot 15 necessary to the change value ΔG of the axial temperature gradient G is calculated and the pulling velocity V of the next ingot 15 is determined. As a result, at every time when the ingot 15 is pulled up, the optimal pulling velocity V for pulling up the defect-free ingot 15 is determined, and accordingly, it is possible to maintain the yield of the defect-free ingot 15 high and stable. Further, at every moment when several to several ten ingots 15 are pulled up, the quality of the ingots 15 is inspected, and the numerical simulation of synthetic heater transfers, the numerical simulation of melt convection and the ratio C are corrected so as to forecast the optimal pulling velocity V for pulling up the defect-free ingot 15, thereby accumulative errors that arise from the structural changes in the furnace of the puller 10 and give influences to the forecasted pulling velocity V can be eliminated, as a consequence, it is possible to maintain the yield of the defect-free ingot 15 further higher and more stable.

Meanwhile, in the above first and second preferred embodiments, as the single crystal, silicon single crystal has been taken up, however in the place thereof, GaAs single crystal, InP single crystal, ZnS single crystal or ZnSe single crystal may also be employed.

EXAMPLE

An example of the present invention is explained in more details with a comparative example hereinafter.

Example 1

As shown in FIG. 6, an ingot 15 whose diameter is 200 mm was pulled up by the puller 10. While one ingot 15 was pulled up, the adjustment of the pulling velocity of the ingot 15 in consideration of the deterioration value of the furnace inside components was not performed, however at every time the ingot 15 was pulled up, the deterioration value of all the furnace inside components that give influences to the axial temperature gradient G was precisely measured, and a numeric value simulation by use of the numerical simulation of synthetic heater transfers and the numerical simulation of melt convection was performed in consideration of the change value of the axial temperature gradient G arising from the deterioration of all the furnace inside components, thereby the adjustment value ΔV of the pulling velocity V of the ingot 15 necessary to the change value ΔG of the axial temperature gradient G was calculated and the pulling velocity V of the next ingot 15 was determined. Further, at every time while nine or ten of ingots 15 were pulled up, the quality of the ingots 15 was inspected, and the numerical simulation of synthetic heater transfers, the numerical simulation of melt convection and the ratio C were corrected so as to forecast the optimal pulling velocity V for pulling up the defect-free ingot 15. By this method, 50 ingots 15 were pulled up. Meanwhile, the quartz crucible was replaced with a new one at every time when one ingot was pulled up.

Comparative Example 1

An ingot 15 whose diameter is 200 mm was pulled up by the puller. While one ingot was pulled up, the adjustment of the pulling velocity of the ingot in consideration of the deterioration value of the furnace inside components was not performed, and at every time the ingot was pulled up, the determination of the pulling velocity V of the ingot in consideration of the deterioration value of the furnace inside components was not performed, but at every time while nine or ten of ingots were pulled up, the quality of the ingots was inspected, and the numerical simulation of synthetic heater transfers, the numerical simulation of melt convection and the ratio C were corrected so as to forecast the optimal pulling velocity V for pulling up the defect-free ingot. By this method, 50 ingots were pulled up. Meanwhile, the quartz crucible was replaced with a new one at every time when one ingot was pulled up.

<Comparative Test 1 and Evaluation>

The 50 ingots pulled up by the method of the example 1, and the 50 ingots pulled up by the method of the comparative example 1 were sliced respectively, and a quality inspection is carried out on them, and the rate of defect-free portion to the entire portion of each ingot was obtained. The result is shown in FIG. 7.

Figure 7:
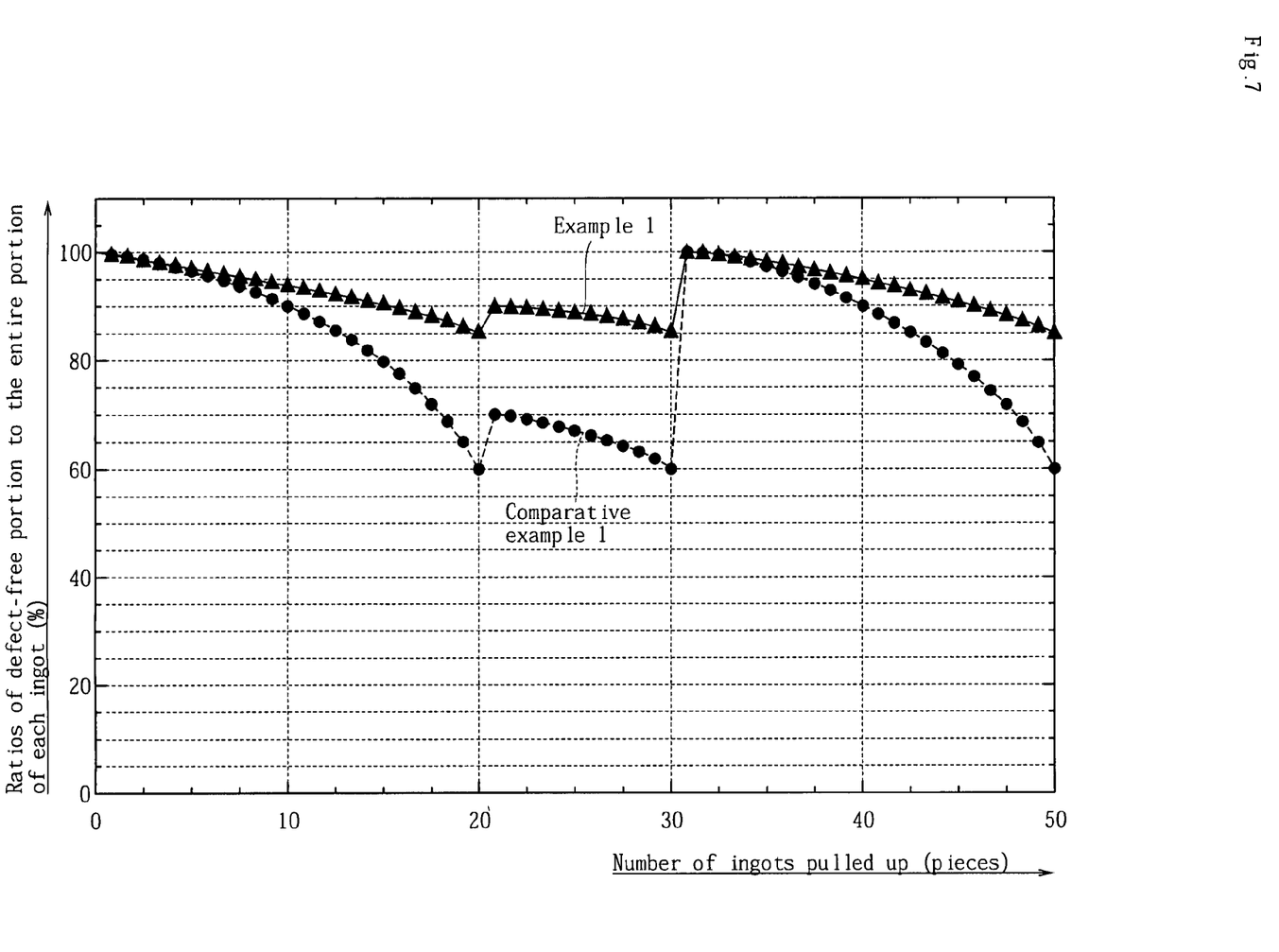
FIG. 7 is a figure showing ratios of defect-free portion to the entire portion of each ingot when 50 ingots are pulled up by the method according to Example 1 and the method according to Comparative Example 1.

As is apparent from FIG. 7, it has been known that the ingots pulled up by the method of the example 1 showed a better defect-free rate than that of the ingots pulled up by the method of the comparative example 1, namely, the ingots pulled up by the method of the example 1 attained a better yield of defect-free ingots.

Meanwhile, in the quality inspection of the above ingots, it takes much time for one puller to pull up nine to ten ingots. For this reason, the result of the quality inspection on the first ingot is made clear at the moment when the ninth or tenth ingot is pulled up, and at the moment when the 11th ingot is pulled up, only the quality of the first ingot can be known, therefore, the numerical simulation of synthetic heater transfers, the numerical simulation of melt convection and the ratio C at the moment when the 11th ingot is pulled up are hardly corrected, and the defect-free portion becomes approximately 90%.

Next, the result of the quality inspection on the tenth ingot is made clear at the moment when the 19th to 20th ingot is pulled up, and at the moment when the 21st ingot is pulled up, only the quality of the tenth ingot can be known, therefore, the numerical simulation of synthetic heater transfers, the numerical simulation of melt convection and the ratio C at the moment when the 21st ingot is pulled up are corrected only by approximately 10% (100%-90%) in the case of the example 1, and the defect-free portion becomes approximately 80%.

Further, the result of the quality inspection on the 20th ingot is made clear at the moment when the 29th to 30th ingot is pulled up, and at the moment when the 31st ingot is pulled up, only the quality of the 20th ingot can be known, therefore, the numerical simulation of synthetic heater transfers, the numerical simulation of melt convection and the ratio C at the moment when the 31st ingot is pulled up are corrected by approximately 30% (100%-70%) in the case of the example 1, and the defect-free portion becomes approximately 100%.

What is claimed is:

1. A method for pulling up a single crystal ingot (15) from a melt (12) where either a single crystal or a poly crystal or the both of them are melted by a heater (18) in the furnace of a single crystal puller (10), the method comprising:

a step for calculating the axial temperature gradient G at the vicinity of the solid-liquid interface (24) in a single crystal ingot (15) that grows from a melt (12) in consideration of the heating value of a heater (18), the dimensions and physical property values of furnace inside components and the convection of the melt (12) before pulling up the single crystal ingot (15) by the puller (10) by use of a numerical simulation of synthetic heater transfers and a numerical simulation of melt convection;

a step for determining the pulling velocity V of the single crystal ingot (15) from an experience value of the ratio C=V/G of the pulling velocity V and the axial temperature gradient G of the single crystal ingot (15) at which the single crystal ingot (15) becomes defect-free, obtained when the single crystal ingot (15) was pulled up by a same type puller as the puller (10) in the past, and the axial temperature gradient G calculated by use of the numerical simulation of synthetic heater transfers and the numerical simulation of melt convection;

a step for pulling up the single crystal ingot (15) by the puller (10) at the pulling velocity V;

a step for roughly measuring the deterioration value of partial furnace inside components that can be measured while the single crystal ingot (15) is pulled up by the puller (10) among the furnace inside components that give influences to the axial temperature gradient G;

a step for roughly forecasting the change value of the axial temperature gradient G to the deterioration value of the partial furnace inside components roughly measured in the puller (10) by use of the numerical simulation of synthetic heater transfers and the numerical simulation of melt convection;

a step for adjusting the pulling velocity V of the single crystal ingot (15) by the puller (10) in such a way that the ratio C should become the experience value according to the change value of the axial temperature gradient G roughly forecasted in the puller (10);

a step for precisely measuring the deterioration value of all the furnace inside components that give influences to the axial temperature gradient G, after adjusting the pulling velocity V of the single crystal ingot (15) by the single crystal puller (10) and pulling up the single crystal ingot (15), and before pulling up the next single crystal ingot (15) by the puller (10);

a step for precisely forecasting the change value of the axial temperature gradient G to the deterioration value of all the furnace inside components precisely measured in the puller (10) by use of the numerical simulation of synthetic heater transfers and the numerical simulation of melt convection;

a step for determining the pulling velocity V of the next single crystal ingot (15) by the puller (10) in such a way that the ratio C should become the experience value according to the change value of the axial temperature gradient G precisely forecasted in the puller (10);

a step for pulling up the next single crystal ingot (15) by the puller (10) at the determined pulling velocity V;

a step for roughly measuring the deterioration value of partial furnace inside components that can be measured while the single crystal ingot (15) is pulled up by the puller (10) among the furnace inside components that give influences to the axial temperature gradient G;

a step for roughly forecasting the chance value of the axial temperature gradient G to the deterioration value of the partial furnace inside components roughly measured in the puller (10) by use of the numerical simulation of synthetic heater transfers and the numerical simulation of melt convection; and a step for adjusting the pulling velocity V of the single crystal ingot (15) by the puller (10) in such a way that the ratio C should become the experience value according to the change value of the axial temperature gradient G roughly forecasted in the puller (10).

2. A method for pulling up a single crystal comprising:

a step for inspecting the quality of an ingot (15) pulled up by the method of claim 1 and correcting a numerical simulation of synthetic heater transfers, a numerical simulation of melt convection and the ratio C;

a step for precisely forecasting the change value of the axial temperature gradient G to the deterioration value of all the furnace inside components that give influences to the axial temperature gradient G precisely measured just after completion of the correcting step by use of the corrected numerical simulation of synthetic heater transfers and the corrected numerical simulation of melt convection;

a step for determining the pulling velocity V of a new single crystal ingot (15) by the puller (10) in such a way that the ratio C should become the corrected value according to the change value of the axial temperature gradient G precisely forecasted in the puller (10);

a step for pulling up the new single crystal ingot (15) by the puller (10) at the determined pulling velocity V;

a step for roughly measuring the deterioration value of partial furnace inside components that can be measured while the single crystal ingot (15) is pulled up by the puller (10) among the furnace inside components that give influences to the axial temperature gradient G;

a step for roughly forecasting the change value of the axial temperature gradient G to the deterioration value of the partial furnace inside components roughly measured in the puller (10) by use of the numerical simulation of synthetic heater transfers and the numerical simulation of melt convection; and a step for adjusting the pulling velocity V of the single crystal ingot (15) by the puller (10) in such a way that the ratio C should become the corrected value according to the change value of the axial temperature gradient G roughly forecasted in the puller (10).

* * * * *